US012563663B2

(12) United States Patent
Lee

(10) Patent No.: US 12,563,663 B2
(45) Date of Patent: Feb. 24, 2026

(54) NETWORK SWITCH INCLUDING TRANSMISSION PORTS WHICH ARE NOT ARRANGED TOWARD A SAME DIRECTION

(71) Applicant: Accton Technology Corporation, Hsin-Chu (TW)

(72) Inventor: Kuan-Tse Lee, Hsin-Chu (TW)

(73) Assignee: Accton Technology Corporation, Hsin-Chu (TW)

( * ) Notice: Subject to any disclaimer, the term of this patent is extended or adjusted under 35 U.S.C. 154(b) by 500 days.

(21) Appl. No.: 17/978,179

(22) Filed: Oct. 31, 2022

(65) Prior Publication Data

US 2023/0140400 A1 May 4, 2023

Related U.S. Application Data

(60) Provisional application No. 63/274,528, filed on Nov. 2, 2021.

(51) Int. Cl.
*H05K 1/02* (2006.01)
*H04L 12/12* (2006.01)
*H05K 1/18* (2006.01)

(52) U.S. Cl.
CPC ......... *H05K 1/0246* (2013.01); *H05K 1/0243* (2013.01); *H05K 1/0274* (2013.01); *H05K 2201/10045* (2013.01)

(58) Field of Classification Search
CPC .......... H05K 2201/10045; H05K 2201/10446; H05K 1/0246; H05K 1/0243; H05K 1/0274; H05K 1/18; H05K 1/0213; H04L 12/12
See application file for complete search history.

(56) References Cited

U.S. PATENT DOCUMENTS

| | | | | |
|---|---|---|---|---|
| 9,794,195 B1 * | 10/2017 | Wilson | ..................... | H04L 49/40 |
| 2016/0183402 A1 * | 6/2016 | Tamarkin | ............... | H05K 1/117 |
| | | | | 361/679.4 |
| 2022/0078532 A1 * | 3/2022 | Shearman | ................ | H05K 1/00 |

* cited by examiner

*Primary Examiner* — Timothy J Thompson
*Assistant Examiner* — Amol H Patel
(74) *Attorney, Agent, or Firm* — Winston Hsu

(57) ABSTRACT

A network switch includes a circuit board and a plurality of transmission ports. The circuit board is disposed in a chassis, and an opening of the chassis is corresponding to a first reference line. The plurality of transmission ports are disposed on an edge of the circuit board. The edge is corresponding to a second reference line, and the first reference line and the second reference line form an acute angle.

12 Claims, 10 Drawing Sheets

NETWORK SWITCH INCLUDING TRANSMISSION PORTS WHICH ARE NOT ARRANGED TOWARD A SAME DIRECTION

CROSS REFERENCE TO RELATED APPLICATIONS

This application claims the benefit of U.S. Provisional Application No. 63/274,528, filed on Nov. 2, 2021. The content of the application is incorporated herein by reference.

BACKGROUND OF THE INVENTION

1. Field of the Invention

The disclosure is related to a network switch, and more particularly, a network switch including transmission ports which are not arranged toward a same direction.

2. Description of the Prior Art

On a circuit board, the transmission ports located on the edge of the circuit board are usually laid out in the same direction. For example, on a printed circuit board (PCB), the transmission ports of user-network interface (UNI) and network-to-network interface (NNI) are usually laid out in the same direction. In other words, when the edge of the circuit board is parallel to the straight edge of the chassis opening, the plurality of transmission ports can be arranged along the straight edge of the circuit board. This setting is relatively simple in design, convenient for the user to plug and unplug the transceiver, and also convenient for observing the number and status of the transmission ports.

However, for high-speed signal transmission requirements, shortcomings of the above-mentioned technologies have been observed. When the chip is placed on the circuit board, the pins of the chip and the transmission port of the circuit board can be coupled through wires. However, for high-speed signal transmission, such as pulse amplitude modulation (PAM) signals of 50 Giga bits per second/lane (50 Gbps/lane) or even 112 Giga bits per second/lane (112 Gbps/lane), the signal paths between the chip pins and the leftmost transmission ports on the circuit board are too long. Similarly, the signal paths between the chip pins and the rightmost transmission ports on the circuit board are too long for high speed signals. The insertion loss caused by excessively long paths cannot be neglected, and the high speed signals cannot be transmitted smoothly.

In theory, a re-timer component or a gearbox component can be disposed between a transmission port and a chip pin to reduce the insertion loss. However, this solution will result in high hardware and software cost and excessive power consumption, so the feasibility is very low. In addition, flyover wires can be used for reducing the insertion loss, but this solution will result in lower yield and lower reliability.

Moreover, if the dielectric constant of the circuit board can be decreased, it is possible to reduce the insertion loss. However, with the development of material technology, it is difficult to reduce the dielectric constant of the circuit board. Hence, a solution is still in need to resolve the problem that the signal path between the transmission port of the circuit board and the chip pin is too long.

SUMMARY OF THE INVENTION

An embodiment includes a network switch including a circuit board and a plurality of transmission ports. The circuit board is disposed in a chassis, and an opening of the chassis is corresponding to a first reference line. The plurality of transmission ports are disposed on an edge of the circuit board, the edge is corresponding to a second reference line, and the first reference line and the second reference line form an acute angle.

Another embodiment includes a network switch including a circuit board, a plurality of first transmission ports and a plurality of second transmission ports. The circuit board is disposed in a chassis and includes a first edge, a second edge and a third edge. The first edge is substantially parallel to the second edge, and the third edge is inside the chassis. A first distance between the first edge and the third edge is shorter than a second distance between the second edge and the third edge. The plurality of first transmission ports are disposed on the first edge. The plurality of second transmission ports are disposed on the second edge.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
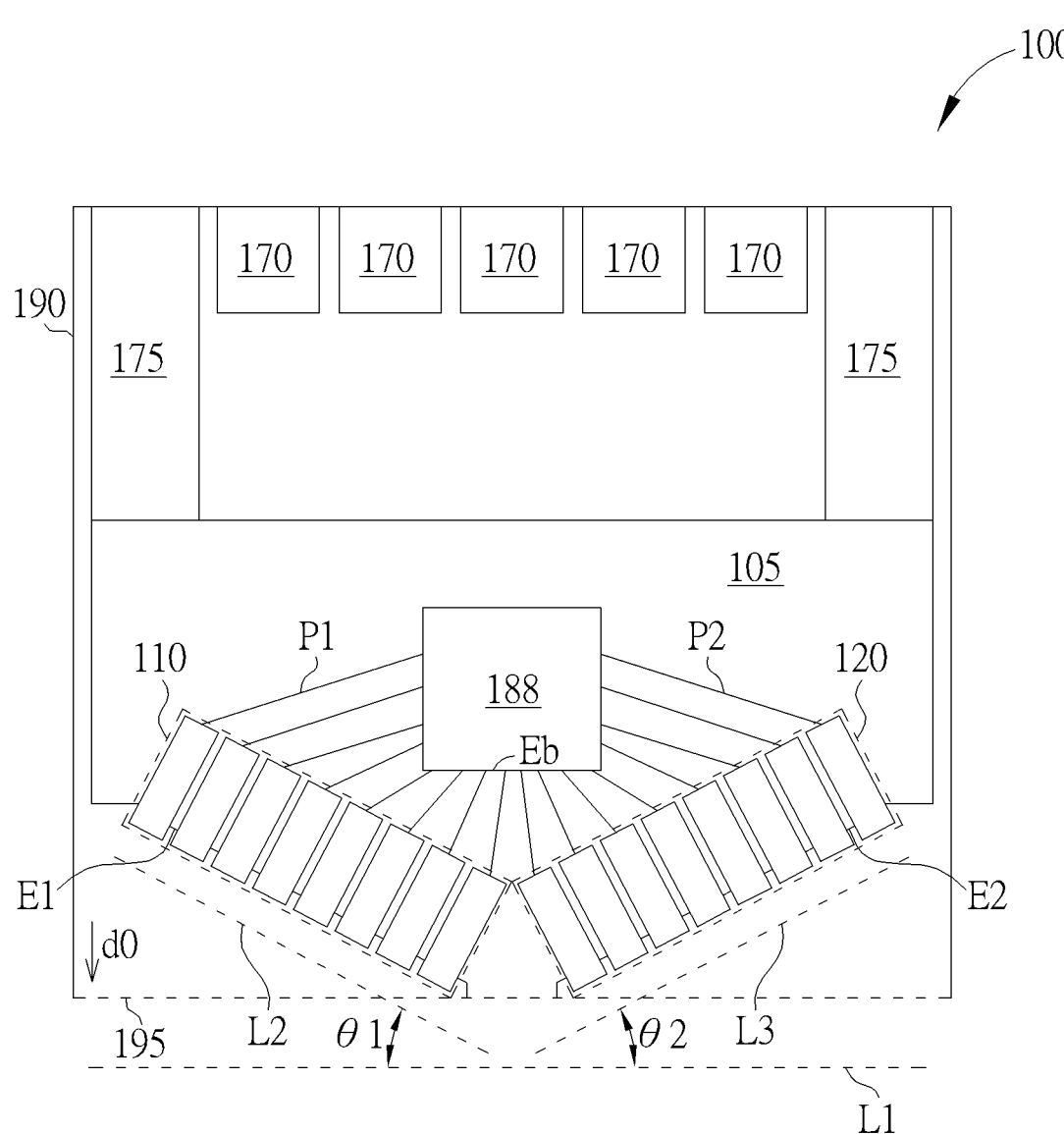
FIG. 1 to FIG. 10 illustrates network switches according to different embodiments.

FIG. 1 illustrates a network switch 100 according to an embodiment. The network switch 100 can include a circuit board 105 and a plurality of first transmission ports 110. The circuit board 105 can be disposed in a chassis 190, and an opening 195 of the chassis 190 can be corresponding to a first reference line L1. As shown in FIG. 1, a plurality of fans 170 and a set of power supply units (PSUs) can be disposed in the chassis 190. The plurality of first transmission ports 110 can be disposed on a first edge E1 of the circuit board 105 for transmitting and/or receiving signals. The first edge E1 can be corresponding to a second reference line L2. The first reference line L1 and the second reference line L2 can form a first acute angle θ1.

In FIG. 1, the first transmission ports 110 are not disposed along the first reference line L1 corresponding the opening 195, and are disposed along the second reference line L2 which is not parallel to the first reference line L1. Hence, each of the first transmission ports 110 is arranged toward a direction different from a direction d0 of the opening 195. Since the first transmission ports 110 are not arranged toward the same direction of the opening 195, the lengths of the conductive paths (e.g. the path P1 in FIG. 1) between the conductive interfaces of a chip 188 (e.g. pins or solder balls) and the first transmission ports 110 can be reduced. As a result, the insertion loss of transmitting signals is reduced. For example, the chip 188 can be an application specific integrated circuit (ASIC).

In FIG. 1, the network switch 100 can optionally further include a plurality of second transmission ports 120 disposed on a second edge E2 of the circuit board 105. The second edge E2 can be corresponding to a third reference line L3, and the first reference line L1 and the third reference line L3 can form a second acute angle θ2. Like the first transmission ports 110, the second transmission ports 120 are not disposed along the first reference line L1 corresponding the opening 195. The second transmission ports 120 can be disposed along the third reference line L3 which is not parallel to the first reference line L1. Hence, each of the second transmission ports 120 is arranged toward a direction different from the direction d0 of the opening 195 and the direction of the first transmission ports 110. The conductive paths (e.g. the path P2 in FIG. 1) between the conductive interfaces of a chip 188 (e.g. pins or solder balls) and the second transmission ports 120 can therefore be shortened. As a result, the insertion loss of transmitting signals is reduced.

Figure 2:
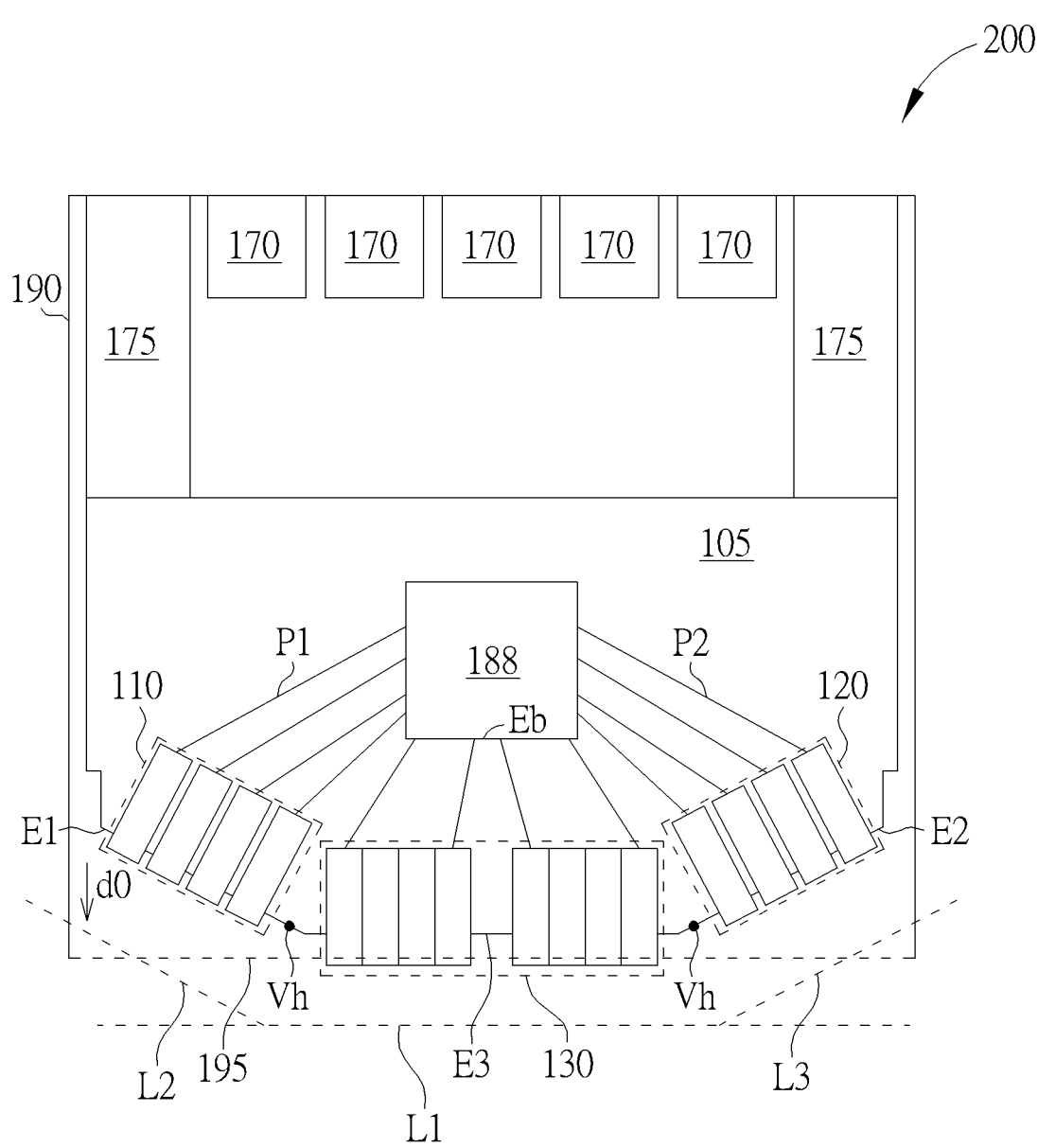

FIG. 2 illustrates a network switch 200 according to another embodiment. Like the network switch 100, the network switch 200 can include the first transmission ports 110 and the second transmission ports 120 which are arranged toward directions different from the direction d0 of the opening 195. As a result, the paths such as the paths P1 and P2 are shortened. In addition, as shown in FIG. 2, the network switch 200 can further include a plurality of third transmission ports 130 disposed on a third edge E3 of the circuit board 105, and the third edge E3 can be corresponding to the first reference line L1. In other words, in a top view, the third transmission ports 130 can be arranged along a line parallel to the opening 195 of the chassis 190, and the third transmission ports 130 can be arranged toward the same direction as the direction d0.

In FIG. 2, the circuit board 105 can optionally further include venting holes Vh. The venting holes Vh in FIG. 2 are shown as an example, and the circuit board 105 in each of FIG. 1 to FIG. 10 can also optionally include one or more venting hole(s).

Figure 3:
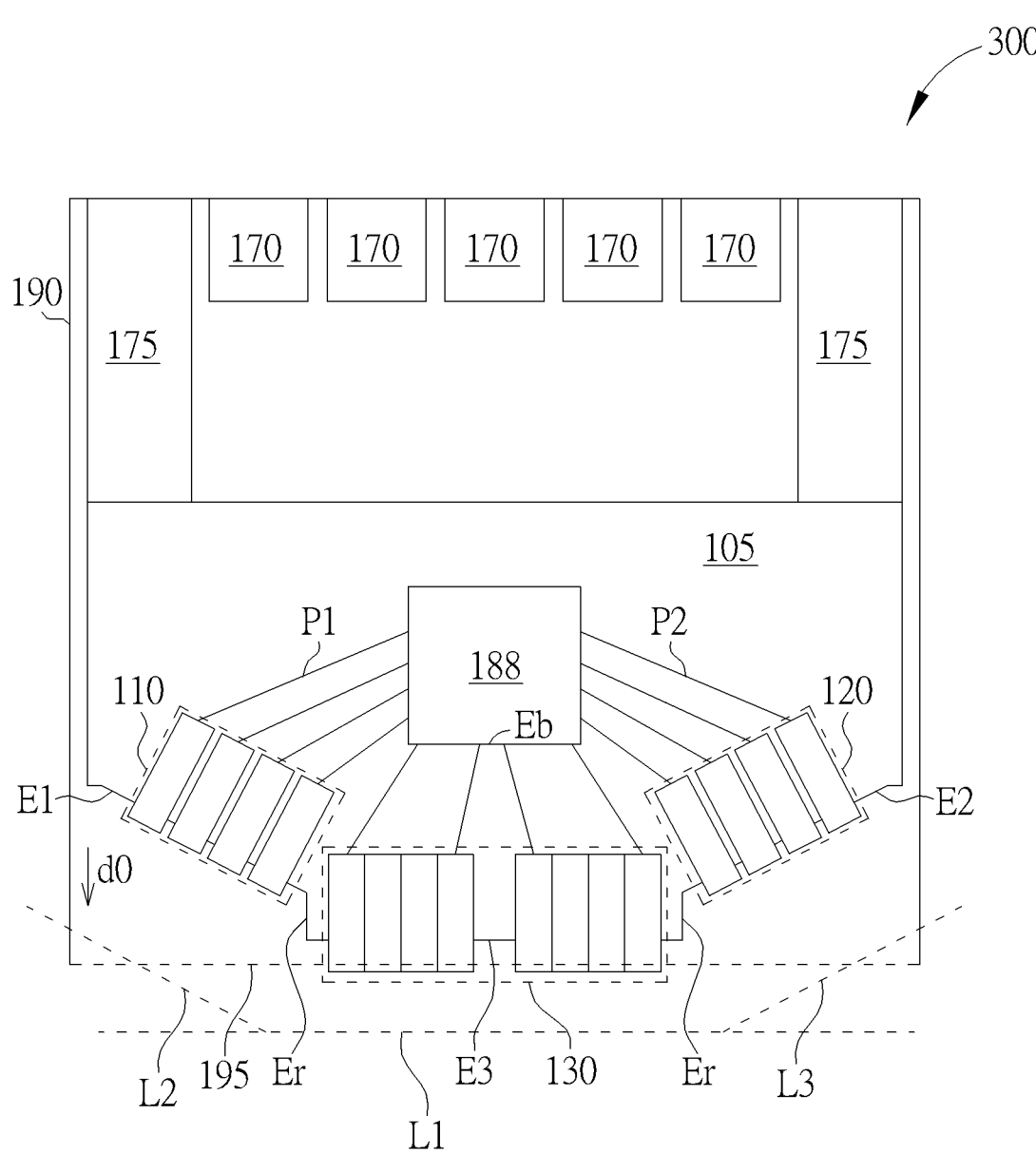

FIG. 3 illustrates a network switch 300 according to an embodiment. Like the network switch 200 in FIG. 2, the network switch 300 can include the first transmission ports 110 and the second transmission ports 120 arranged toward directions different from the direction d0 of the opening 195, and the transmission ports 130 can be arranged toward the same direction as the direction d0. However, in FIG. 3, the circuit board 105 can further include recessing edges Er. One of the recessing edges Er can be located between the first edge E1 and the third edge E3. In addition, the other one of the recessing edges Er can be located between the second edge E2 and the third edge E3. The paths between the chip and the transmission ports (e.g. the paths P1 and P2) can be further shortened by using the recessing edges Er.

As shown in FIG. 1 to FIG. 3, the chip 188 can be disposed on the circuit board 105 and electrically connected to the first transmission ports 110 and the second transmission ports 120. A bottom side Eb of the chip 188 can be substantially parallel to the first reference line L1 in a top view. In other words, the bottom side Eb of the chip 188 can be substantially parallel to the opening 195 of the chassis 190.

Figure 4:
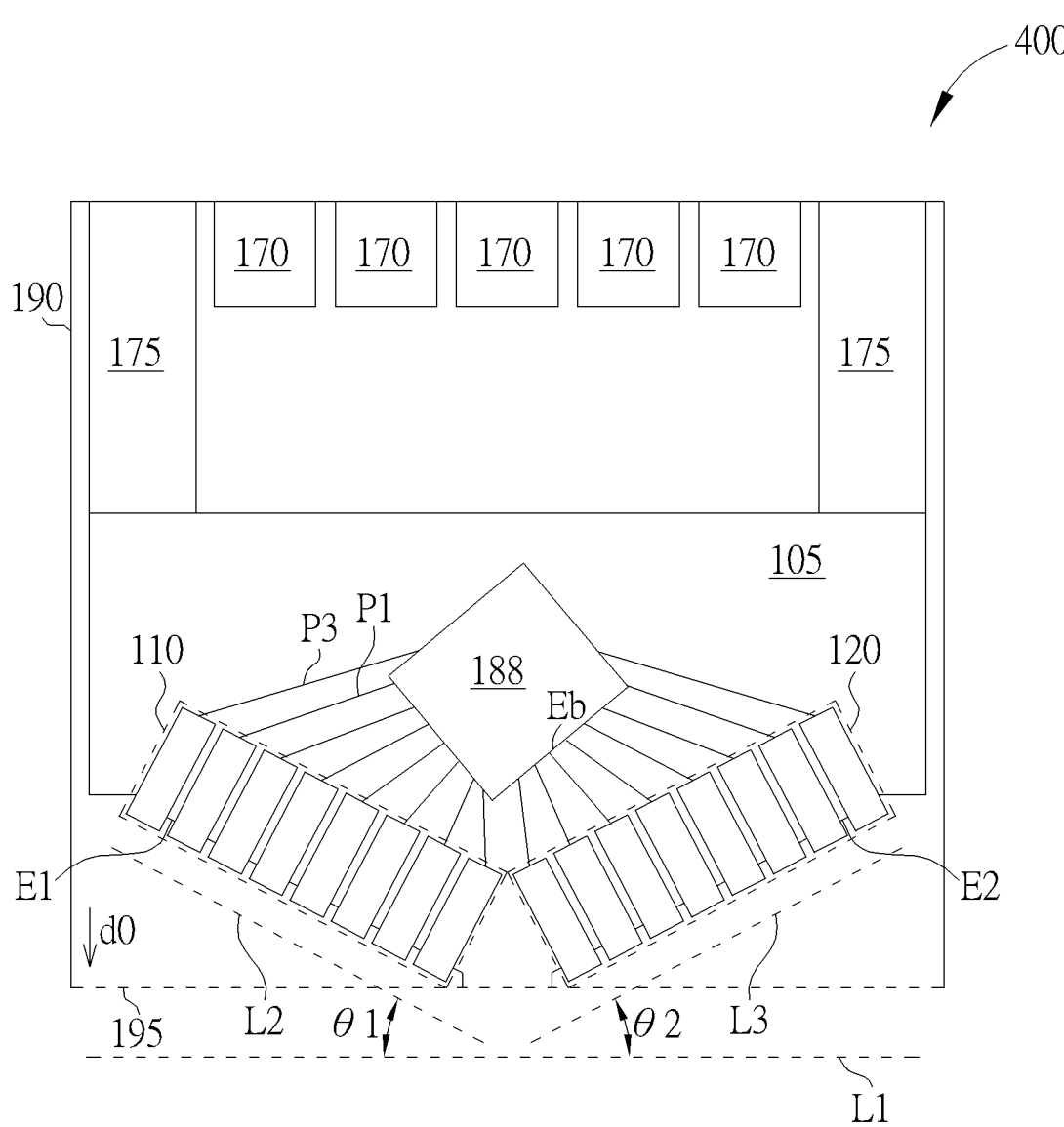

FIG. 4 illustrates a network switch 400 according to another embodiment. In FIG. 4, the chip 188 can be arranged in another way. In FIG. 4, the bottom side Eb of the chip 188 can be substantially not parallel to the first reference line L1 in a top view. In other words, the bottom side Eb of the chip 188 can be substantially not parallel to the opening 195 of the chassis 190. Compared with FIG. 1 to FIG. 3, the chip 188 in FIG. 4 can be rotated by a predetermined angle to be disposed. By rotating the chip 188 by a predetermined angle, the paths between the chip 188 and the transmission ports (e.g. the paths P1 and P3 in FIG. 4) can be further shortened to reduce the insertion loss.

In FIG. 4, the layout of the transmission ports is similar to that in FIG. 1. However, this is an example, and the chip 188 in each of FIG. 1 to FIG. 10 can be optionally rotated to meet requirements.

Figure 5:
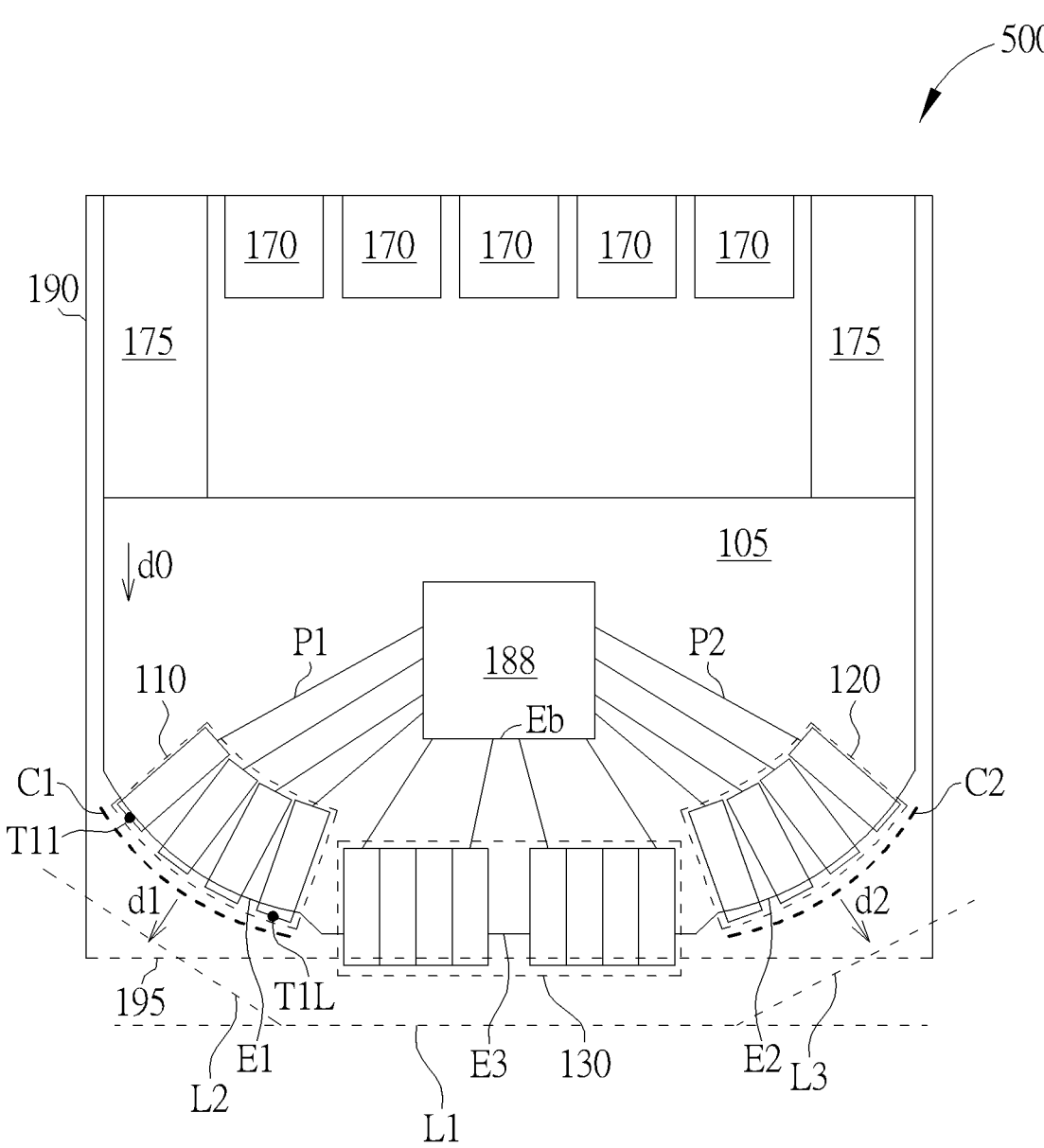

FIG. 5 illustrates a network switch 500 according to another embodiment. The network switch 500 can be similar to the network switch 200 in FIG. 2. However, as shown in FIG. 5, the first transmission ports 110 of the network switch 500 can be disposed along a reference convex line C1. In a top view, the reference convex line C1 can be convex toward a direction d1. Likewise, in FIG. 5, the second transmission ports 120 of the network switch 500 can be disposed along a reference convex line C2, and the reference convex line C2 can be convex toward a direction d2 in the top view. In FIG. 5, the first edge E1 of the circuit board 105 can be convex toward the direction d1 instead of being straight, and/or the second edge E2 of the circuit board 105 can be convex toward the direction d2 instead of being straight. By disposing the first transmission ports 110 and/or the second transmission ports 120 along reference convex line(s), the flexibility of design is increased. In FIG. 5, for example, the second reference line L2 can be parallel to a straight line passing through a connection terminal T11 of the first one of the first transmission ports 110 and a connection terminal T1L of the last one of the first transmission ports 110.

Figure 6:
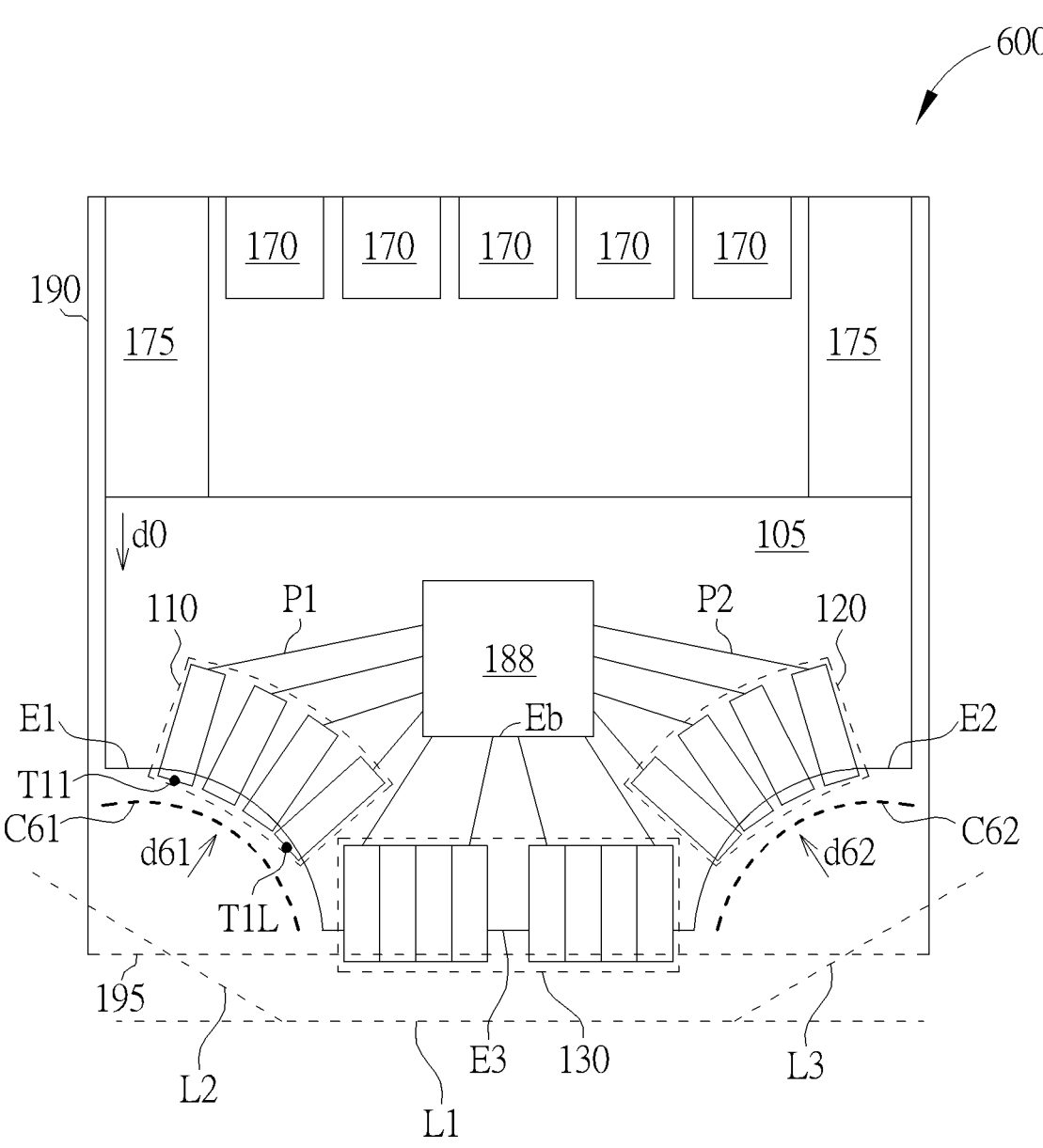

FIG. 6 illustrates a network switch 600 according to an embodiment. The network switch 600 can be similar to the network switch 200 in FIG. 2. However, as shown in FIG. 6, the first transmission ports 110 of the network switch 600 can be disposed along a reference concave line C61. In a top view, the reference concave line C61 can be concave toward a direction d61. Likewise, in FIG. 6, the second transmission ports 120 of the network switch 600 can be disposed along a reference concave line C62, and the reference concave line C62 can be concave toward a direction d62 in the top view. In FIG. 6, the first edge E1 of the circuit board 105 can be concave toward the direction d61 instead of being straight, and/or the second edge E2 of the circuit board 105 can be concave toward the direction d2 instead of being straight. By disposing the first transmission ports 110 and/or the second transmission ports 120 along reference concave line(s), the design flexibility is increased. In FIG. 6, for example, the second reference line L2 can be parallel to a straight line passing through a connection terminal T11 of the first one of the first transmission ports 110 and a connection terminal T1L of the last one of the first transmission ports 110.

Figure 7:
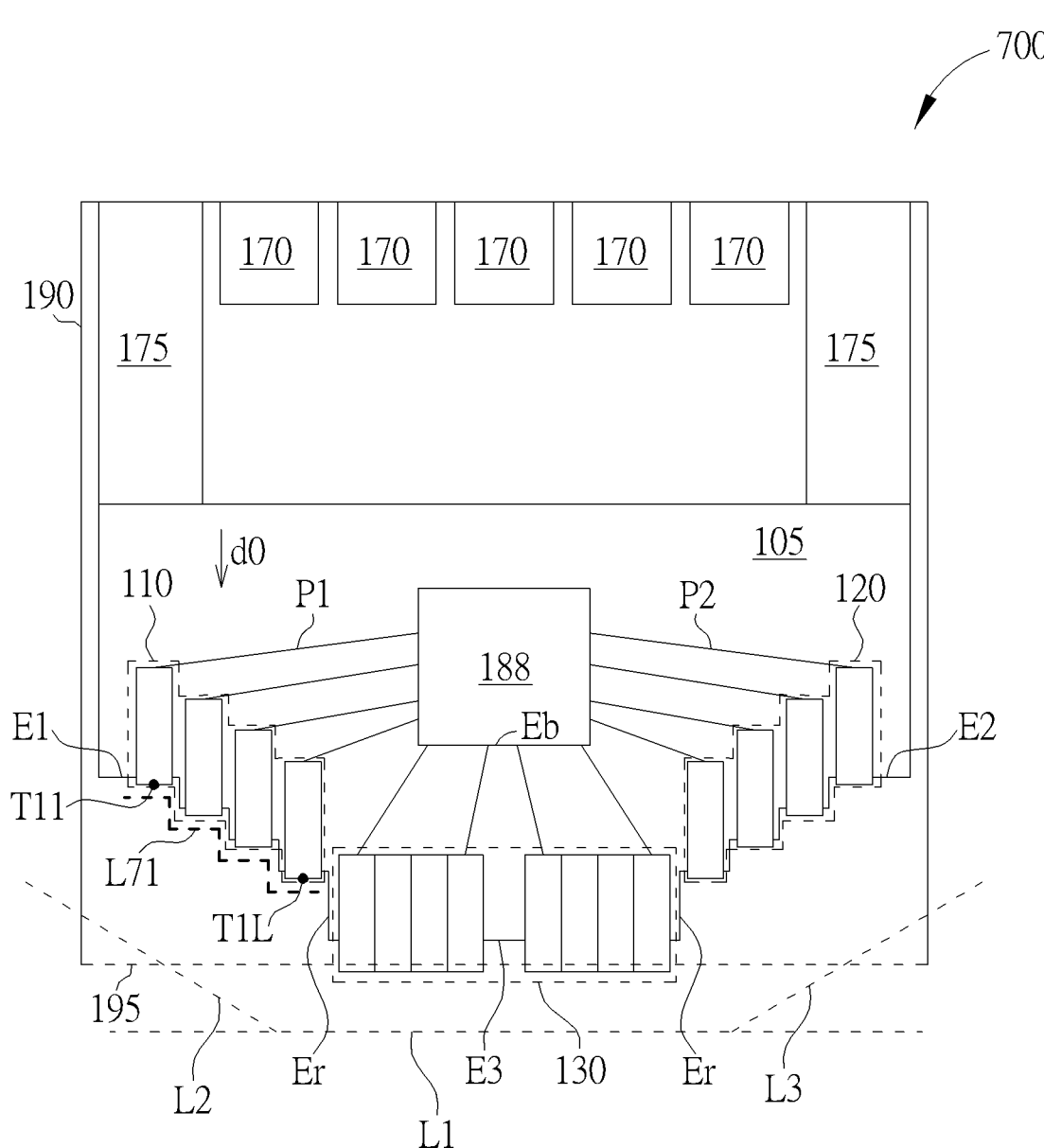

FIG. 7 illustrates a network switch 700 according to another embodiment. In FIG. 7, the first transmission ports 110 can be disposed in a stepped manner along a step-shaped reference line L71. For example, a second reference line L2 corresponding to the first transmission ports 110 can be parallel to a straight line passing through a connection terminal T11 of the first one of the first transmission ports 110 and a terminal connection T1L of the last one of the first transmission ports 110. In FIG. 7, like FIG. 3, the circuit board 105 can have recessing edges Er to adjust the lengths of the paths between the transmission ports and the conductive interfaces of a chip 188 (e.g. pins or solder balls).

Figure 8:
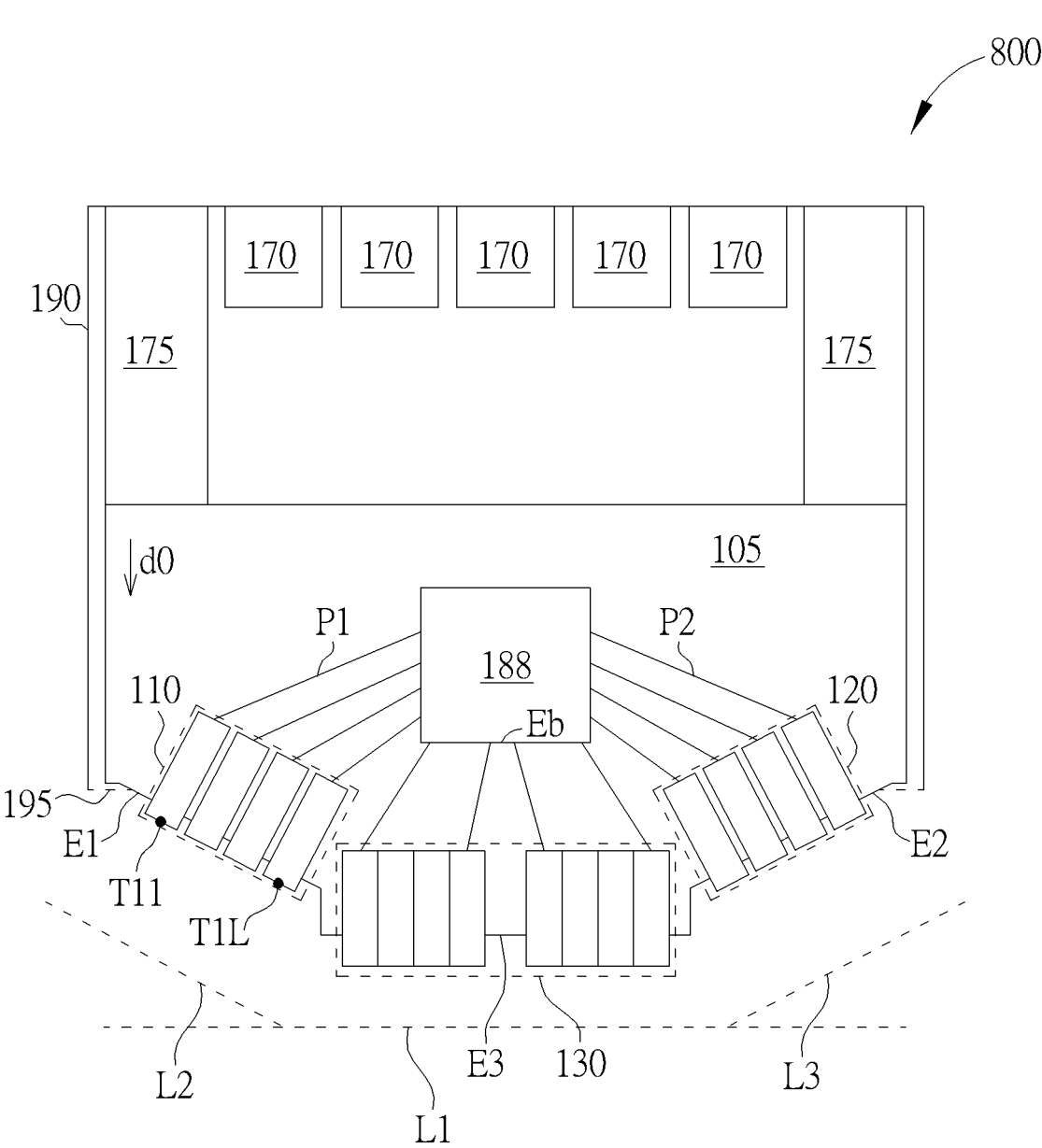

FIG. 8 illustrates a network switch 800 according to another embodiment. In FIG. 8, the connection terminals T11 to T1L of the first transmission ports 110 can be located outside the opening 195 of the chassis 190. Hence, it is convenient to connect external cables to the first transmission ports 110 and observe the statuses of the first transmission ports 110. Likewise, the connection terminals of the second transmission ports 120 and the third transmission ports 130 can be located outside the opening 195.

Figure 9:
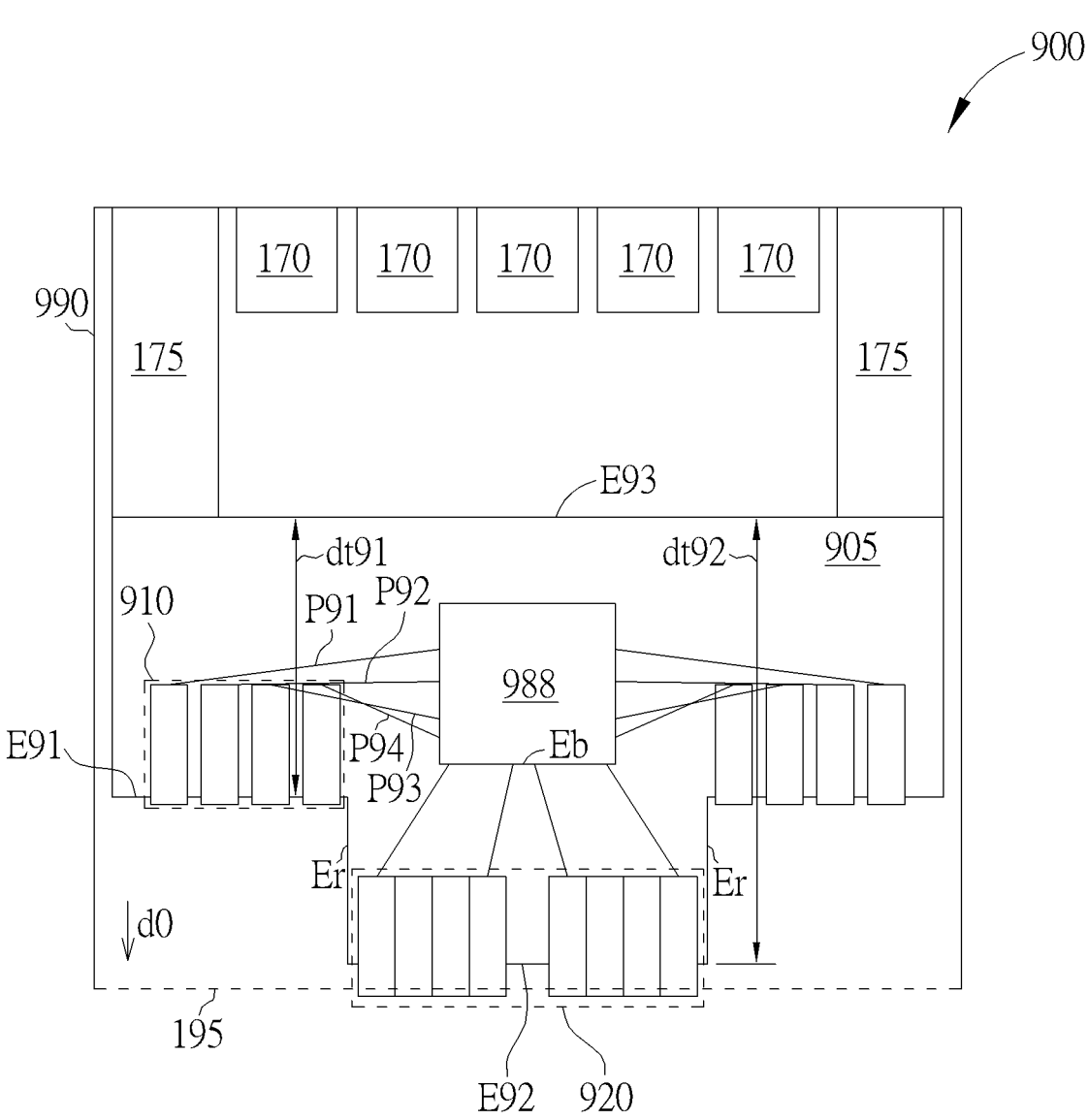

FIG. 9 illustrates a network switch 900 according to another embodiment. The network switch 900 can include a circuit board 905, a plurality of first transmission ports 910 and a plurality of second transmission ports 920. The circuit board 905 can be disposed in a chassis 990 and include a first edge E91, a second edge E92 and a third edge E93. The first transmission ports 910 can be disposed on the first edge E91. The second transmission ports 920 can be disposed on the second edge E92. The first edge E91 can be substantially parallel to the second edge E92. The third edge E93 can be inside the chassis 990. A first distance dt91 between the first edge E91 and the third edge E93 can be shorter than a second distance dt92 between the second edge E92 and the third edge E93. In FIG. 9, the circuit board 905 can have a recessing edge Er between the first edge E91 and the second edge E92.

By disposing the first transmission ports 910 and the second transmission ports 920 as shown in FIG. 9, the paths between the transmission ports and the conductive interfaces of a chip 188 (e.g. pins or solder balls) can be shortened. Since the distance between the first transmission ports 910 and the third edge E93 is different from the distance between the second transmission ports 920 and the third edge E93, it can regarded that the transmission ports are not arranged in a row.

In FIG. 9, paths P91, P92, P93 and P94 seem to overlap with the components of the transmission ports and overlap with one another in a top view. However, since different paths can be implemented with different conductive layers of the circuit board 905, signals can be effectively transmitted between the chip 988 and the transmission ports.

Figure 10:
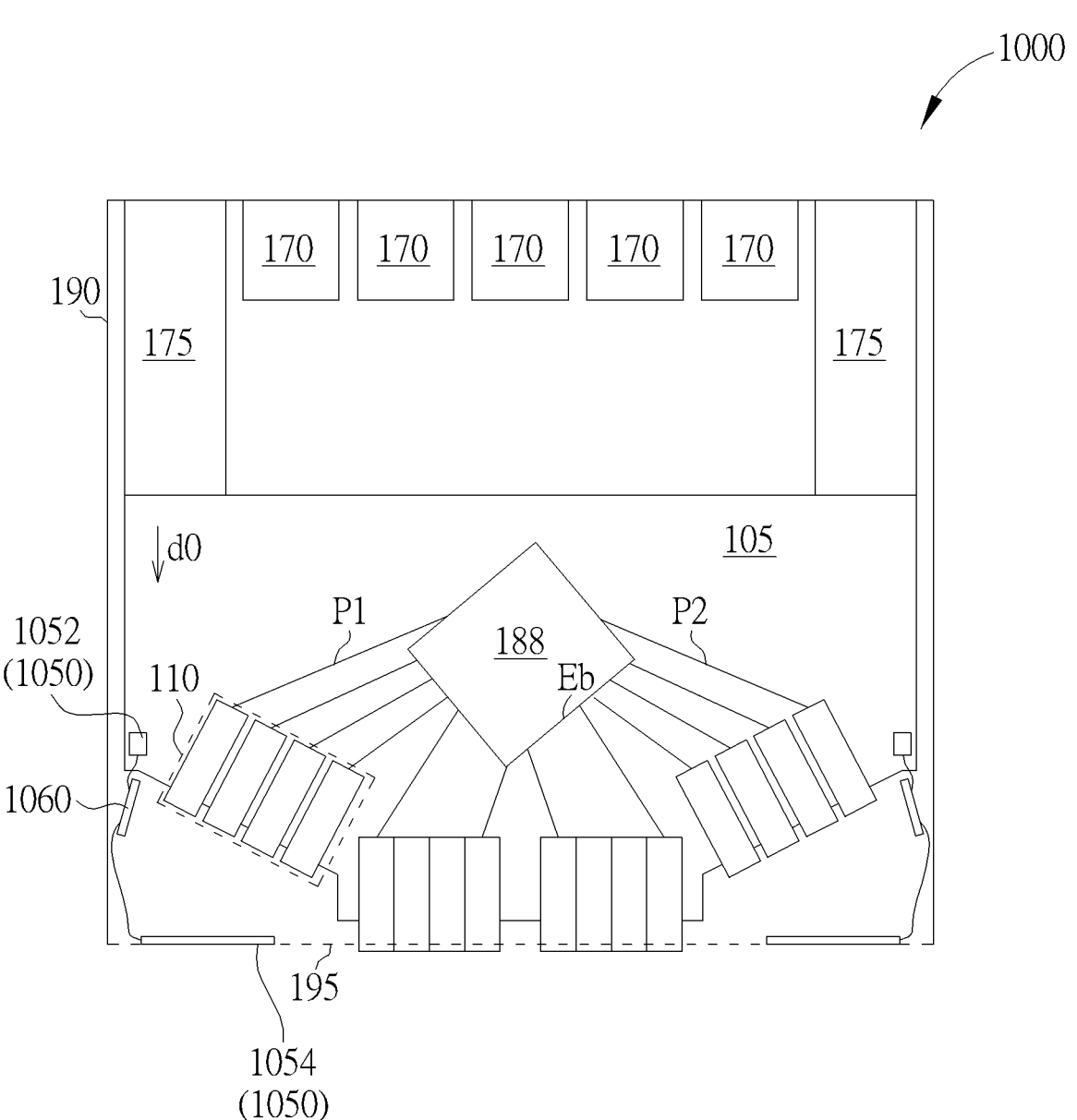

FIG. 10 illustrates a network switch 1000 according to an embodiment. The network switch 1000 can be similar to the network switch 400 in FIG. 4, and the similarities are not repeatedly described. In FIG. 10, the network switch 1000 can further include a light-emitting device 1050 coupled to the first transmission ports 110 for emitting light signals to indicate statuses of the first transmission ports 110. The light-emitting device 1050 can include a control unit 1052 and lights 1054. For example, the lights 1054 can include light-emitting diodes (LEDs).

In FIG. 10, the network switch 1000 can further include an optical reflection device 1060 used to reflect light signals of the first transmission ports 110 to indicate statuses of the first transmission ports 110. For example, the optical reflection device 1060 can include a light source and a reflector (e.g. mirror), so that a user can observe the light signals of the transmission ports 110 through reflection. In FIG. 10, the light-emitting device 1050 and the optical reflection device 1060 can be used alternatively for a user to observe the statuses of the first transmission ports 110 inside the chassis 190.

In FIG. 10, the placement and setting of the transmission ports and the chip can be like that in FIG. 4. This is an example, and embodiments are not limited thereto. In the network switches of FIG. 1 to FIG. 7 and FIG. 9, the light-emitting device 1050 and/or the optical reflection device 1060 of FIG. 10 can be installed for the convenience of observing the statuses of the transmission ports.

In FIG. 1 to FIG. 10, the circuit boards can be printed circuit boards (PCBs). A path between a transmission port on an edge of a circuit board and a conductive interface of a chip (e.g. pin or solder ball) can be shorter than 12 inches. The chip can be coupled to the transmission ports using the conductive traces of the circuit board without using a re-timer component, a gearbox component or a flyover wire. In FIG. 1 to FIG. 10, each transmission port disposed on the edge of the circuit board can meet the requirements of pulse amplitude modulation (PAM) specification. In FIG. 1 to FIG. 10, each transmission port disposed on the edge of the circuit board can transmit, receive or transceive signals. In

6

FIG. 1 to FIG. 10, each transmission port disposed on the edge of the circuit board can support the user-network interface (UNI) and/or the network-to-network interface (NNI).

In summary, by using one of the network switches 100 to 1000, the shape of the circuit board can be adjusted to adjust the layout of the transmission ports on the edges of the circuit board, so as to shorten the paths between the transmission ports and the conductive interfaces of the chip. With the solutions provided by embodiments, the difficulties of reducing the dielectric constant of the circuit board can be avoided. For high speed applications, such as signal transmissions defined in the specifications of 50G PAM and 112G PAM, the solutions provided by embodiments are helpful to reduce the insertion loss, thereby solving the problems of high speed signal transmissions.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A network switch comprising:
a circuit board disposed in a chassis, wherein an opening of the chassis is corresponding to a first reference line;
a plurality of first transmission ports disposed on a first edge of the circuit board, wherein the first edge is corresponding to a second reference line, and the first reference line and the second reference line form a first acute angle; and
an optical reflection device configured to reflect light signals of the plurality of first transmission ports to indicate statuses of the plurality of first transmission ports.

2. The network switch of claim 1, further comprising:
a plurality of second transmission ports disposed on a second edge of the circuit board, wherein the second edge is corresponding to the first reference line.

3. The network switch of claim 1, further comprising:
a plurality of second transmission ports disposed on a second edge of the circuit board, wherein the second edge is corresponding to a third reference line, and the first reference line and the third reference line form a second acute angle.

4. The network switch of claim 3, further comprising:
a plurality of third transmission ports disposed on a third edge of the circuit board, wherein the third edge is corresponding to the first reference line.

5. The network switch of claim 4, wherein the circuit board has a recessing edge between the first edge and the third edge.

6. The network switch of claim 2, wherein:
a chip is disposed on the circuit board, the chip is electrically connected to the plurality of first transmission ports and the plurality of second transmission ports, and a bottom side of the chip is substantially not parallel to the first reference line in a top view.

7. The network switch of claim 1, wherein the plurality of first transmission ports are disposed along a reference convex line.

8. The network switch of claim 1, wherein the plurality of first transmission ports are disposed along a reference concave line.

9. The network switch of claim 1, wherein the plurality of first transmission ports are disposed in a stepped manner.

10. The network switch of claim 1, wherein connection terminals of the plurality of first transmission ports are disposed outside the opening.

11. The network switch of claim 1, further comprising:

a chip disposed on the circuit board and coupled to the plurality of first transmission ports;

wherein a path between a conductive interface of the chip and each of the first transmission ports is shorter than 12 inches.

12. The network switch of claim 1, further comprising:

a chip disposed on the circuit board and coupled to the plurality of first transmission ports through a conductive trace of the circuit board.

\* \* \* \* \*